(12) United States Patent
Cho et al.

(10) Patent No.: US 12,495,649 B2
(45) Date of Patent: Dec. 9, 2025

(54) DISPLAY APPARATUS USING SEMICONDUCTOR LIGHT-EMITTING DEVICE

(71) Applicant: LG ELECTRONICS INC., Seoul (KR)

(72) Inventors: Byoungkwon Cho, Seoul (KR); Junghoon Kim, Seoul (KR); Byungjun Kang, Seoul (KR); Chilkeun Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 729 days.

(21) Appl. No.: 17/793,295

(22) PCT Filed: Jan. 21, 2020

(86) PCT No.: PCT/KR2020/000983
§ 371 (c)(1),
(2) Date: Jul. 15, 2022

(87) PCT Pub. No.: WO2021/145499
PCT Pub. Date: Jul. 22, 2021

(65) Prior Publication Data
US 2023/0352643 A1    Nov. 2, 2023

(30) Foreign Application Priority Data

Jan. 16, 2020 (KR) .......................... 10-2020-0006103

(51) Int. Cl.
*H10H 20/857* (2025.01)
*H01L 25/075* (2006.01)
(Continued)

(52) U.S. Cl.
CPC ....... *H10H 20/857* (2025.01); *H01L 25/0753* (2013.01); *H10H 20/831* (2025.01)

(58) Field of Classification Search
CPC .................. H10H 20/819; H10H 20/8506; H01L 25/167; H01L 25/0753
See application file for complete search history.

(56) References Cited

U.S. PATENT DOCUMENTS

| 2013/0214302 A1 | 8/2013 | Yeh et al. |
| 2017/0062492 A1 | 3/2017 | Bae et al. |

(Continued)

FOREIGN PATENT DOCUMENTS

| KR | 10-2017-0022755 A | 3/2017 |
| KR | 10-2018-0015940 A | 2/2018 |

(Continued)

*Primary Examiner* — Antonio B Crite
(74) *Attorney, Agent, or Firm* — Birch, Stewart, Kolasch & Birch, LLP

(57) ABSTRACT

Discussed is a display device including a base portion, assembled electrodes extending along one direction on the base portion, a dielectric layer to cover the assembled electrodes, a partition wall portion on the dielectric layer while forming a plurality of cells, and a plurality of semiconductor light emitting diodes seated in the plurality of cells, respectively and to emit light of different colors. The plurality of semiconductor light emitting diodes emitting different colors include recessed portions having different shapes. Further, a surface of the plurality of cells includes a solder portion protruding to correspond to the recessed portions of the plurality of semiconductor light emitting diodes seated in the plurality of cells, respectively.

20 Claims, 14 Drawing Sheets

(51) Int. Cl.
*H01L 25/16* (2023.01)
*H10H 20/819* (2025.01)
*H10H 20/82* (2025.01)
*H10H 20/825* (2025.01)
*H10H 20/831* (2025.01)
*H10H 20/85* (2025.01)
*H10H 29/14* (2025.01)
*H10H 20/01* (2025.01)

(56) References Cited

U.S. PATENT DOCUMENTS

2017/0133550 A1 5/2017 Schuele et al.
2019/0326477 A1 10/2019 Kim et al.
2020/0185368 A1 6/2020 Park et al.

FOREIGN PATENT DOCUMENTS

| KR | 10-2018-0089771 A |   | 8/2018 |
|----|-------------------|---|--------|
| KR | 10-2018-0130845 A |   | 12/2018 |
| KR | 10-2019-0087221 A |   | 7/2019 |
| KR | 20190087221 A | * | 7/2019 |
| KR | 10-2019-0106885 A |   | 9/2019 |
| KR | 10-2019-0122118 A |   | 10/2019 |
| WO | WO 2019/132050 A1 |   | 7/2019 |

* cited by examiner

FIG. 12
(a) 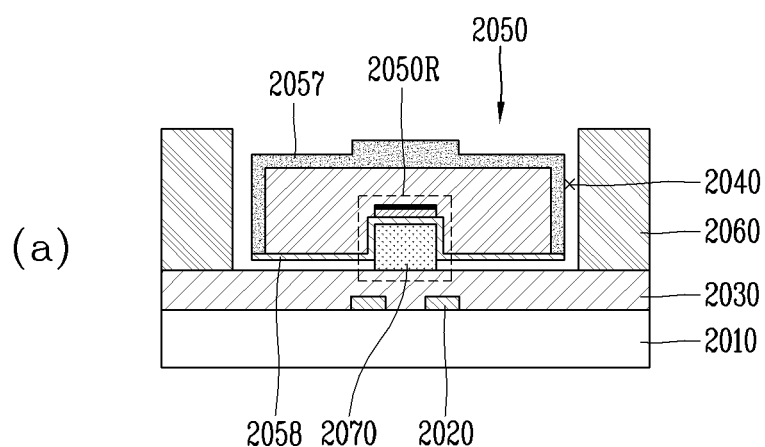
(b) 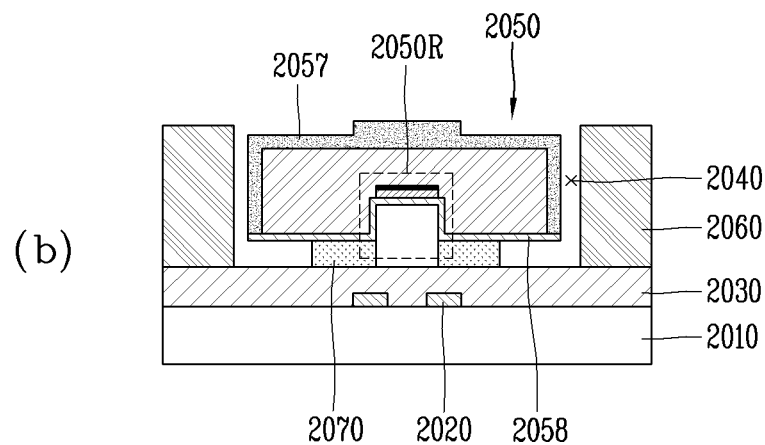

DISPLAY APPARATUS USING SEMICONDUCTOR LIGHT-EMITTING DEVICE

TECHNICAL FIELD

The present disclosure relates to a display device using a semiconductor light emitting diode, and in particular, to a display device using a semiconductor light emitting diode having a size of several to several tens of µm.

BACKGROUND ART

Recently, liquid crystal displays (LCD), organic light-emitting diode (OLED) displays, and micro LED displays are competing to implement a large-area display in the field of display technology.

Meanwhile, if a semiconductor light emitting diode (micro LED) having a cross-sectional area or diameter of 100 µm or less is used in the display, the display does not absorb light using a polarizing plate or the like, and thus, very high efficiency can be provided. However, since a large display requires millions of semiconductor light emitting diodes, it is difficult to transfer the elements, compared to other technologies.

Examples of a technology that is currently being developed as a transfer process include pick & place, laser lift-off (LLO), or self-assembly. Among them, the self-assembly is a method in which a semiconductor light emitting diode finds its own position in a fluid, and is the most advantageous method for realizing a large-screen display device.

The self-assembly includes a method of directly assembling a semiconductor light emitting diode on a final substrate to be used in a product, and a method of assembling a semiconductor light emitting diode on an assembly substrate and then transferring the semiconductor light emitting diode to a final substrate through an additional transfer process. The method of directly assembling on the final substrate is efficient in terms of process. The use of the assembly substrate has an advantage in that a structure for self-assembly can be added without limitation. Therefore, the two methods are selectively used.

DISCLOSURE

Technical Problem

One object of the present disclosure is to provide a display device having a structure (position selectivity) capable of self-assembling semiconductor light emitting diodes emitting different colors to a substrate at the same time. To this end, the semiconductor light emitting diode and the substrate each include a recessed portion and a solder portion corresponding thereto.

Another object of the present disclosure is to provide a display device having a structure in which a semiconductor light emitting diode can be electrically connected to a substrate while being assembled to the substrate. To this end, a recessed portion and a solder portion may include an ohmic electrode and a wiring electrode for electrical connection.

Another object of the present disclosure is to provide a display device having a structure capable of preventing separation of a semiconductor light emitting diode assembled on a substrate. To this end, a solder portion of the substrate may include a magnetic layer.

Technical Solution

A display device according to an embodiment of the present disclosure includes a base portion; assembled electrodes extending along one direction on the base portion; a dielectric layer formed to cover the assembled electrodes; a partition wall portion stacked on the dielectric layer while forming a plurality of cells; and semiconductor light emitting diodes seated in the cell and to emit light of different colors, in which among the semiconductor light emitting diodes, the semiconductor light emitting diodes emitting different colors include recessed portions having different shapes on one surface thereof and, the bottom surface of the cell includes a solder portion protruding to correspond to the recessed portion of the semiconductor light emitting diode seated in the cell.

In an embodiment of the present disclosure, the semiconductor light emitting diode includes a first conductivity type electrode; a first conductivity type semiconductor layer formed on the first conductivity type electrode; an active layer formed on the first conductivity type semiconductor layer; a second conductivity type semiconductor layer formed on the active layer; a second conductivity type electrode formed on the second conductivity type semiconductor layer; and an undoped semiconductor layer formed on the second conductivity type semiconductor layer.

In an embodiment of the present disclosure, the recessed portion is formed to penetrate through the undoped semiconductor layer, and the second conductivity type electrode is formed in a region different from the region in which the undoped semiconductor layer is formed among entire region of the second conductivity type semiconductor layer.

In an embodiment of the present disclosure, the semiconductor light emitting diode further includes a passivation layer covering a portion of a surface of the semiconductor light emitting diode including the first conductivity type electrode on another side of the semiconductor light emitting diode.

In an embodiment of the present disclosure, the passivation layer on another side of the semiconductor light emitting diode is patterned to be smaller than an area of the undoped semiconductor layer formed on a side of the semiconductor light emitting diode.

In an embodiment of the present disclosure, the semiconductor light emitting diode further includes a metal film formed along the undoped semiconductor layer and the recessed portion on one side of the semiconductor light emitting diode.

In an embodiment of the present disclosure, the second conductivity type electrode further includes a magnetic layer.

In an embodiment of the present disclosure, the solder portion further includes a magnetic layer.

In an embodiment of the present disclosure, the solder portion is formed to be thicker than a thickness of the undoped semiconductor layer based on a stacking direction of the semiconductor light emitting diode.

The display device of further includes a first wiring electrode formed on the dielectric layer, in which the first wiring electrode is formed to contact the solder portion under the solder portion and is disposed between the assembled electrodes.

Advantageous Effect

According to an embodiment of the present disclosure, the display device can perform self-assembly by simultaneously inputting semiconductor light emitting diodes emitting different colors into a fluid chamber, thereby shortening the assembly time.

In addition, the semiconductor light emitting diode seated in the cell can be connected to the wiring electrode through bonding with the solder portion, and furthermore, there is an effect that it can be more stably fixed to the substrate by the magnetic force acting between the semiconductor light emitting diode and the solder portion.

DESCRIPTION OF DRAWINGS

FIG. 12 is a view showing a comparison of a state where a semiconductor light emitting diode is normally assembled on a substrate and a state where a semiconductor light emitting diode is incorrectly assembled on a substrate.

BEST MODE

Figure 1:
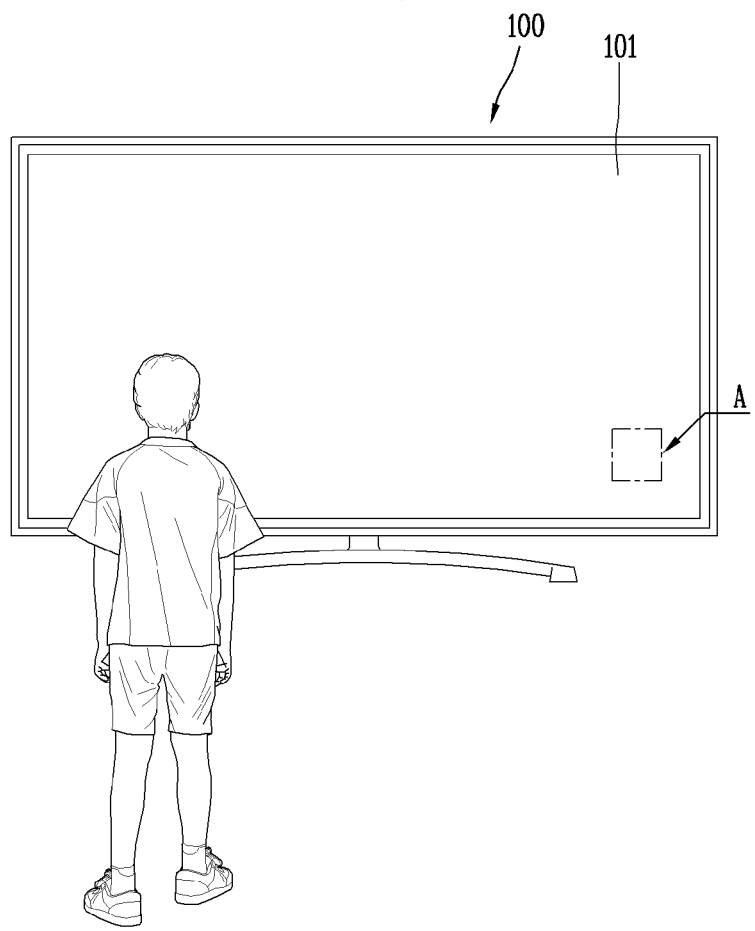
FIG. 1 is a conceptual diagram showing an embodiment of a display device using a semiconductor light emitting diode of the present disclosure.

Hereinafter, the embodiments disclosed herein will be described in detail with reference to the accompanying drawings, and the same or similar elements are designated with the same numeral references regardless of the numerals in the drawings and their redundant description will be omitted. The suffixes "module" and "unit or portion" for components used in the following description are merely provided only for facilitation of preparing this specification, and thus they are not granted a specific meaning or function. In addition, when it is determined that the detailed description of the related known technology may obscure the gist of embodiments disclosed herein in describing the embodiments, a detailed description thereof will be omitted. Further, it should be noted that the accompanying drawings are only for easy understanding of the embodiments disclosed in the present specification, and should not be construed as limiting the technical spirit disclosed in the present specification by the accompanying drawings. It is also understood that when an element, such as a layer, region, or substrate, it is referred to as being "on" another element, it may be directly present on the other element or intervening elements in between.

The display device described herein may include mobile phones, smart phones, laptop computers, digital broadcasting terminals, personal digital assistants (PDA), portable multimedia players (PMP), navigation systems, slate PCs, a Tablet PC, Ultra Books, digital TVs, digital signages, head mounted displays (HMDs), desktop computers, and the like. However, it will be readily apparent to those skilled in the art that the configuration according to the embodiments described in the present specification may be applied to a device capable of display having even a new product form to be developed later.

Figure 2:
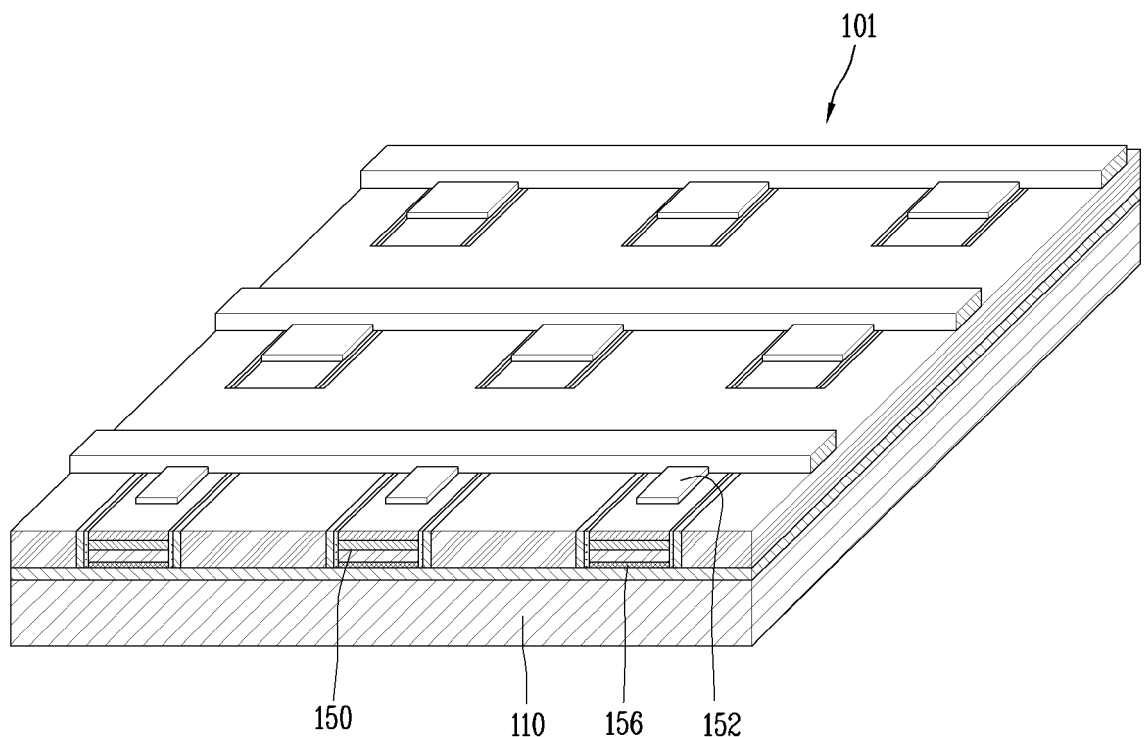
FIG. 2 is a partially enlarged view of portion A of the display device of FIG. 1.
Figure 3:
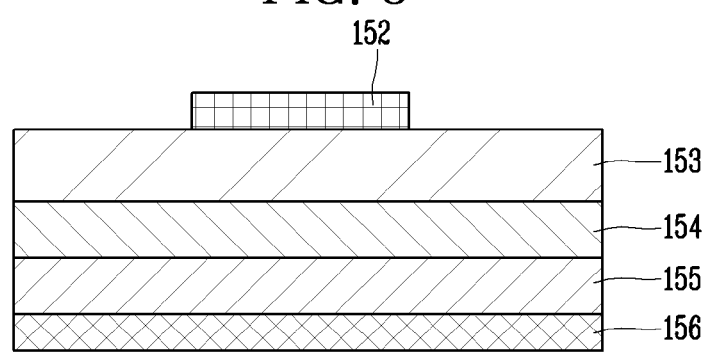
FIG. 3 is an enlarged view of the semiconductor light emitting diode of FIG. 2.
Figure 4:
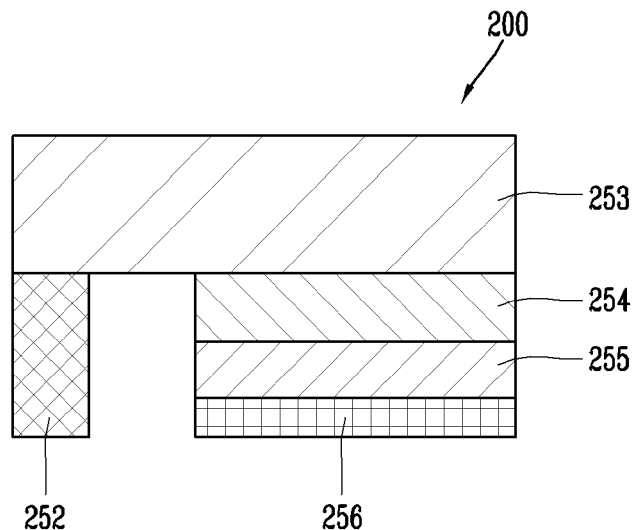
FIG. 4 is an enlarged view showing another embodiment of the semiconductor light emitting diode of FIG. 2.

FIG. 1 is a conceptual diagram showing an embodiment of a display device using a semiconductor light emitting diode of the present disclosure, FIG. 2 is a partially enlarged view of portion A of the display device of FIG. 1, FIG. 3 is an enlarged view of the semiconductor light emitting diode of FIG. 2, and FIG. 4 is an enlarged view showing another embodiment of the semiconductor light emitting diode of FIG. 2.

As shown, information processed by a controller of a display device 100 may be output from a display module 140. A closed-loop-type case 101 surrounding edges of the display module may form a bezel of the display device.

The display module 140 may include a panel 141 on which images are displayed, and the panel 141 may include a micro-sized semiconductor light emitting diode 150 and a wiring board 110 on which the semiconductor light emitting diode 150 is mounted.

Wirings may be formed on the wiring board 110 to be connected to an n-type electrode 152 and a p-type electrode 156 of the semiconductor light emitting diode 150. Through this, the semiconductor light emitting diode 150 may be provided on the wiring board 110 as an individual pixel that emits light itself.

An image displayed on the panel 141 is visual information, and is implemented by independently controlling light emission of sub-pixels arranged in a matrix form through the wirings.

In the present disclosure, a micro LED (Light Emitting Diode) is exemplified as a type of the semiconductor light emitting diode 150 that converts current into light. The micro LED may be a light emitting diode formed in a small size of 100 micro or less. In the semiconductor light emitting diode 150, blue, red, and green colors are provided in light emitting regions, respectively, and a unit pixel may be realized by a combination thereof. That is, the unit pixel may mean a minimum unit for realizing one color, and at least three micro LEDs may be provided in the unit pixel.

More specifically, referring to FIG. 3, the semiconductor light emitting diode 150 may have a vertical structure.

For example, the semiconductor light emitting diode 150 is mainly made of gallium nitride (GaN), and indium (In) and/or aluminum (Al) are added together to implement a high output light emitting diode that emits various lights including blue.

The vertical semiconductor light emitting diode may include a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 positioned in a lower portion may be electrically connected to the p-electrode of the wiring board, and the n-type electrode 152 positioned in an upper portion may be electrically connected to the n-electrode at the upper side of the semiconductor light emitting diode. The vertical semiconductor light emitting diode 150 has a great advantage in that it is possible to reduce the chip size because electrodes are arranged up and down.

As another example, referring to FIG. 4, the semiconductor light emitting diode may be a flip chip type light emitting diode.

For this example, the semiconductor light emitting diode 250 may include a p-type electrode 256, a p-type semiconductor layer 255 on which the p-type electrode 256 is formed, an active layer 254 formed on the p-type semiconductor layer 255, an n-type semiconductor layer 253 formed on the active layer 254, and an n-type electrode 252 spaced apart from the p-type electrode 256 in the horizontal direction on the n-type semiconductor layer 253. In this case, both the p-type electrode 256 and the n-type electrode 152 may be electrically connected to the p-electrode and n-electrode of the wiring board under the semiconductor light emitting diode.

The vertical semiconductor light emitting diode and the horizontal semiconductor light emitting diode may be a green semiconductor light emitting diode, a blue semiconductor light emitting diode, or a red semiconductor light emitting diode, respectively. In the case of the green semiconductor light emitting diode and the blue semiconductor light emitting diode, gallium nitride (GaN) is mainly used, and indium (In) and/or aluminum (Al) are added together to implement a high output light emitting diode that emits green or blue light. For this example, the semiconductor light emitting diode may be a gallium nitride thin film formed in various layers such as n-Gan, p-Gan, AlGaN, InGan, etc. Specifically, the p-type semiconductor layer may be P-type GaN, and the n-type semiconductor layer may be N-type GaN. However, in the case of the red semiconductor light emitting diode, the p-type semiconductor layer may be P-type GaAs, and the n-type semiconductor layer may be N-type GaAs.

In addition, the p-type semiconductor layer may be P-type GaN doped with Mg on the p-electrode side, and the n-type semiconductor layer may be N-type GaN doped with Si on the n-electrode side. In this case, the above-described semiconductor light emitting diodes may be semiconductor light emitting diodes having no active layer.

Meanwhile, referring to FIGS. 1 to 4, since the light emitting diodes are very small, unit pixels that emit light themselves may be arranged in a high definition in the display panel, thereby realizing a high-definition display device.

In the display device using the semiconductor light emitting diode of the present disclosure described above, the semiconductor light emitting diode grown on a wafer and formed through mesa and isolation is used as an individual pixel. In this case, the micro-sized semiconductor light emitting diode 150 needs to be transferred to the wafer at a predetermined position on a substrate of the display panel. There is a pick and place technique as such a transfer technique, but the success rate is low and a lot of time is required. As another example, there is a technique of transferring several devices at a time using a stamp or a roll, but it is not suitable for a large screen display due to a limitation in yield. The present disclosure proposes a new manufacturing method and manufacturing apparatus for a display device that can solve these problems.

To this end, a new method of manufacturing a display device will be described below. FIGS. 5A to 5E are conceptual views for describing a new process of manufacturing the semiconductor light emitting diode.

In the present specification, a display device using a passive matrix (PM) type semiconductor light emitting diode is taken as an example. However, the examples described below are also applicable to an active matrix (AM) type semiconductor light emitting diode. In addition, although a method of self-assembling a horizontal semiconductor light emitting diode is described as an example, it is also applicable to a method of self-assembling a vertical semiconductor light emitting diode.

Figure 5A:
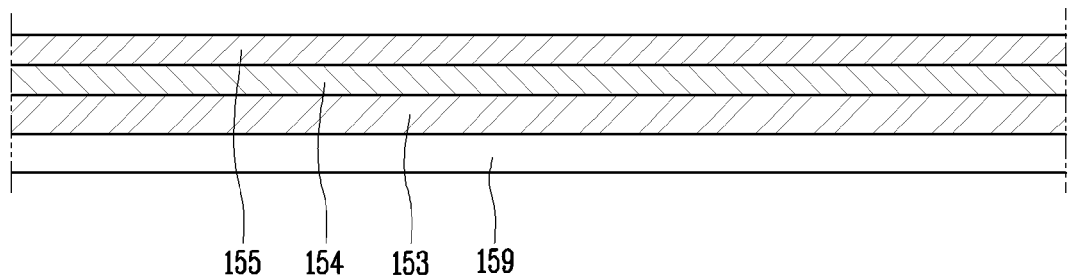
FIGS. 5A to 5E are conceptual views for describing a new process of manufacturing the semiconductor light emitting diode.

First, according to the manufacturing method, a first conductivity type semiconductor layer 153, an active layer 154, and a second conductivity type semiconductor layer 155 are individually grown on a growth substrate 159 (FIG. 5A).

After the first conductivity type semiconductor layer 153 is grown, the active layer 154 is grown on the first conductivity type semiconductor layer 153, and then the second conductivity type semiconductor layer 155 is grown on the active layer 154. In this way, when the first conductivity type semiconductor layer 153, the active layer 154, and the second conductivity type semiconductor layer 155 are sequentially grown, as shown in FIG. 5A, the first conductivity type semiconductor layer 153, the active layer 154 and the second conductive semiconductor layer 155 form a stacked structure.

In this case, the first conductivity type semiconductor layer 153 may be a p-type semiconductor layer, and the second conductivity type semiconductor layer 155 may be an n-type semiconductor layer. However, the present disclosure is not necessarily limited thereto, and the first conductivity type may be n-type and the second conductivity type may be p-type.

In addition, although the present embodiment exemplifies the case in which the active layer is present, a structure in which the active layer is not present is also possible in some cases as described above. As an example, the p-type semiconductor layer may be P-type GaN doped with Mg, and the n-type semiconductor layer may be N-type GaN doped with Si on the n-electrode side.

The growth substrate 159 (wafer) may be formed of a material having a light-transmitting property, for example, any one of sapphire (Al2O3), GaN, ZnO, and AIO, but is not limited thereto. In addition, the growth substrate 159 may be formed of a material suitable for semiconductor material growth, a carrier wafer. The growth substrate 159 may be formed of a material having excellent thermal conductivity, and may include a conductive board or an insulating board, for example, a SiC board having higher thermal conductivity than a sapphire (Al2O3) board, or use at least one of Si, GaAs, GaP, InP, and Ga2O3.

Figure 5B:
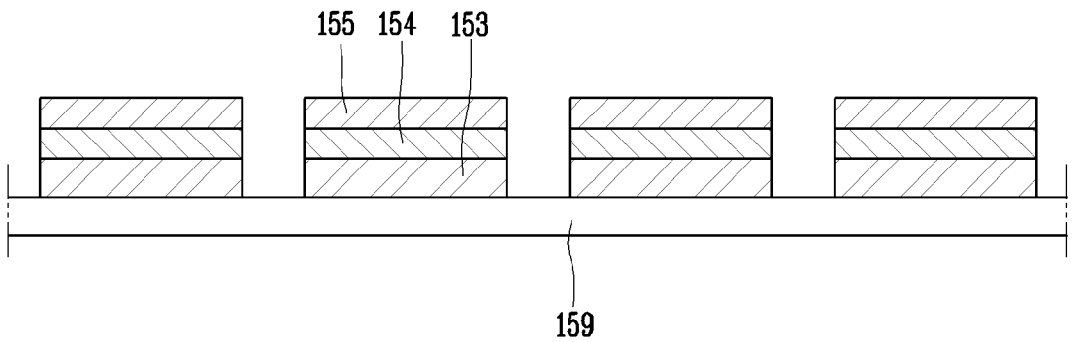

Next, at least a portion of the first conductivity type semiconductor layer 153, the active layer 154, and the second conductivity type semiconductor layer 155 are removed to form a plurality of semiconductor light emitting diodes (FIG. 5B).

More specifically, isolation is performed such that the plurality of light emitting diodes form a light emitting diode array. That is, the first conductivity type semiconductor layer 153, the active layer 154, and the second conductivity type semiconductor layer 155 are vertically etched to form a plurality of semiconductor light emitting diodes.

In the case of forming a horizontal type semiconductor light emitting diode, a mesa process in which the active layer 154 and the second conductivity type semiconductor layer 155 are partially removed in the vertical direction and the first conductivity type semiconductor layer 153 is exposed to the outside and thereafter, isolation in which the first conductivity type semiconductor layer is etched to form a plurality of semiconductor light emitting diode arrays may be performed.

Figure 5C:
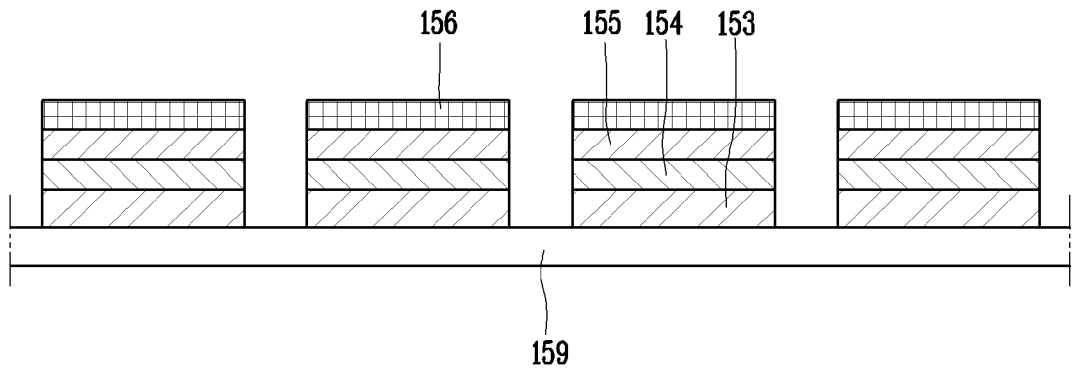

Next, second conductivity type electrodes 156 (or p-type electrodes) are formed on one surface of the second conductivity type semiconductor layer 155 (FIG. 5C). The second conductivity type electrode 156 may be formed by a deposition method such as sputtering, but the present disclosure is not limited thereto. However, when the first conductive semiconductor layer and the second conductive semiconductor layer are an n-type semiconductor layer and a p-type semiconductor layer, respectively, the second conductivity type electrode 156 may be an n-type electrode.

Figure 5D:
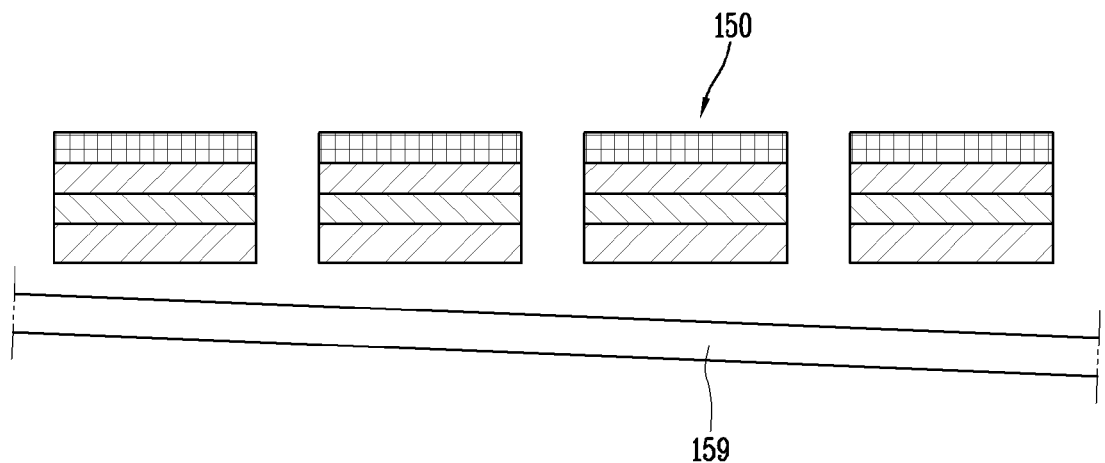

Then, the growth substrate 159 is removed to provide a plurality of semiconductor light emitting diodes. For example, the growth substrate 159 may be removed using a laser lift-off (LLO) method or a chemical lift-off (CLO) method (FIG. 5D).

Figure 5E:
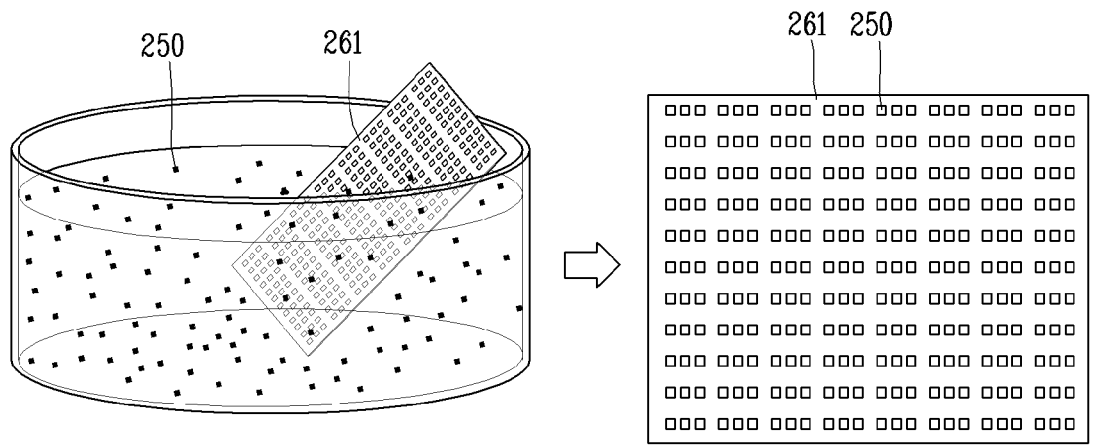

Thereafter, the semiconductor light emitting diodes 150 are seated on a board in a chamber filled with a fluid (FIG. 5E).

For example, the semiconductor light emitting diodes 150 and the board are put in the chamber filled with a fluid, and the semiconductor light emitting diodes are self-assembled onto the board 161 using flow, gravity, surface tension, and the like. In this case, the board may be an assembled board 161.

As another example, it is also possible to put the wiring board in a fluid chamber instead of the assembly board 161 so that the semiconductor light emitting diodes 150 are directly seated on the wiring board. In this case, the board may be a wiring board. However, for convenience of description, in the present disclosure, the board is provided as, for example, the assembly board 161 on which the semiconductor light emitting diodes 1050 are seated.

Cells (not shown) in which the semiconductor light emitting diodes 150 are inserted may be provided in the assembly board 161 to facilitate mounting of the semiconductor light emitting diodes 150 on the assembly board 161. Specifically, cells in which the semiconductor light emitting diodes 150 are seated are formed in the assembly board 161 at positions where the semiconductor light emitting diodes 150 are to be aligned with wiring electrodes. The semiconductor light emitting diodes 150 are assembled to the cells while moving in the fluid.

After a plurality of semiconductor light emitting diodes are arrayed on the assembly board 161, the semiconductor light emitting diodes of the assembly board 161 are transferred to a wiring board, enabling large-area transfer. Accordingly, the assembly board 161 may be referred to as a temporary board.

On the other hand, in order to apply the self-assembly method described above to the manufacture of a large-screen display, it is necessary to increase transfer yield. The present disclosure proposes a method and apparatus for minimizing the influence of gravity or frictional force and preventing non-specific binding in order to increase the transfer yield.

In this case, in the display device according to the present disclosure, a magnetic material is disposed on the semiconductor light emitting diode to move the semiconductor light emitting diode using magnetic force, and the semiconductor light emitting diode is seated at a predetermined position by using an electric field during movement. Hereinafter, the transfer method and apparatus will be described in more detail with the accompanying drawings.

Figure 6:
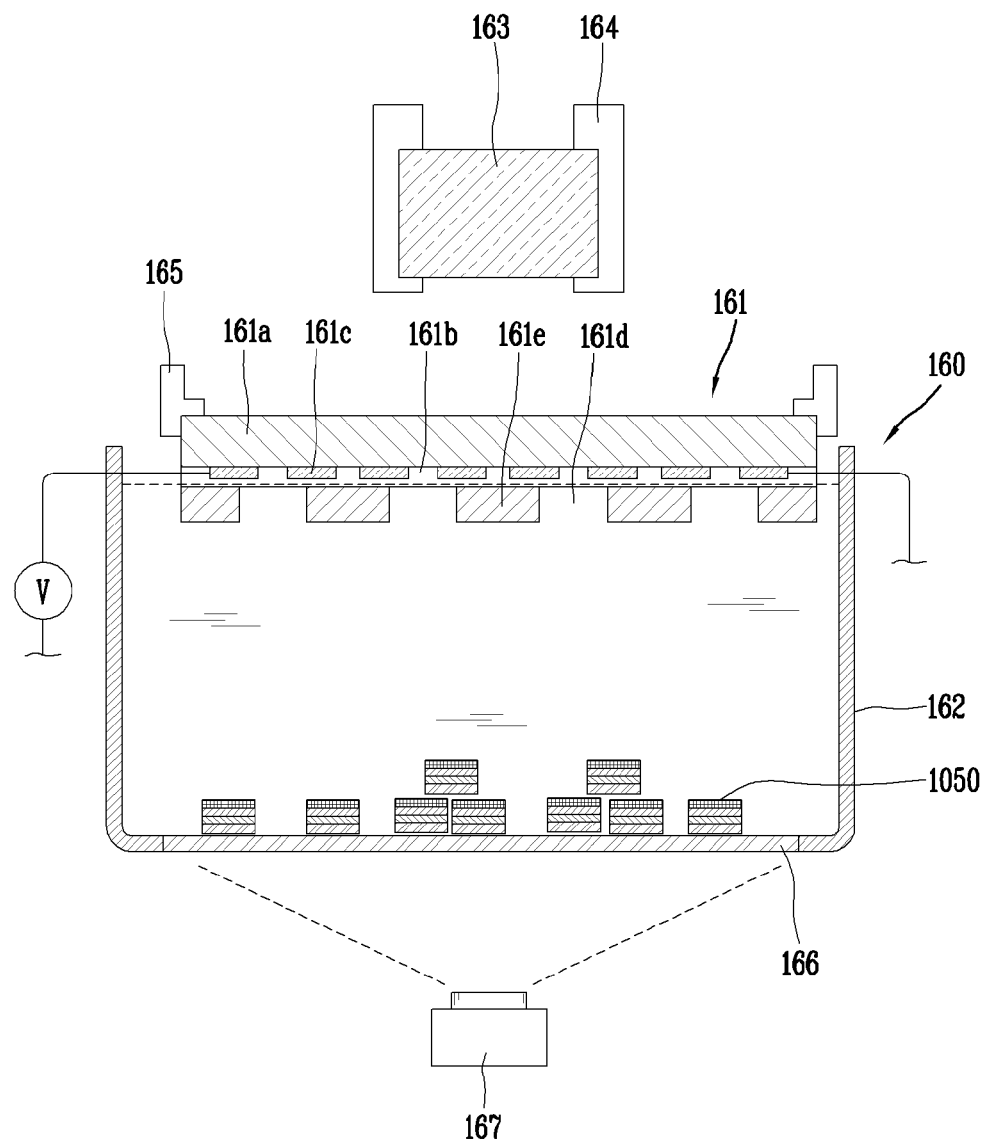
FIG. 6 is a conceptual diagram showing an example of a self-assembly apparatus of a semiconductor light emitting diode according to the present disclosure.
Figure 7:
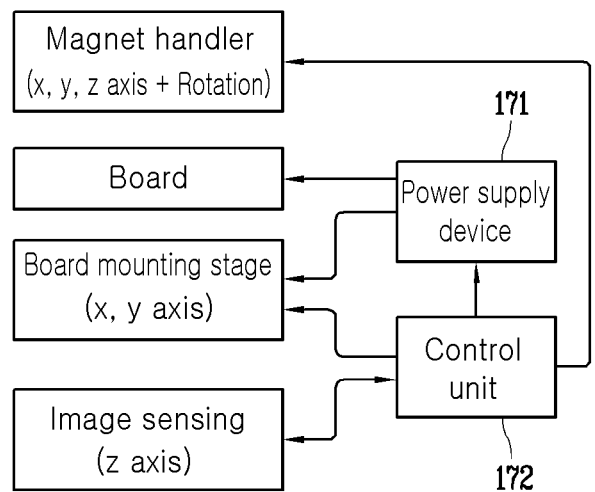
FIG. 7 is a block diagram of the self-assembly apparatus of FIG. 6.

FIG. 6 is a conceptual diagram showing an example of a self-assembly apparatus of a semiconductor light emitting diode according to the present disclosure, and FIG. 7 is a block diagram of the self-assembly apparatus of FIG. 6. FIGS. 8A to 8E are conceptual views showing a process of self-assembling a semiconductor light emitting diode using the self-assembly apparatus of FIG. 6, and FIG. 9 is a conceptual diagram for describing the semiconductor light emitting diode of FIGS. 8A to 8E.

Referring to FIGS. 6 and 7, a self-assembly apparatus 160 of the present disclosure may include a fluid chamber 162, a magnet 163 and a position control unit 164.

The fluid chamber 162 has a space for accommodating a plurality of semiconductor light emitting diodes. The space may be filled with a fluid, and the fluid may include water or the like as an assembly solution. Accordingly, the fluid chamber 162 may be a water tank and may be configured in an open type. However, the present disclosure is not limited thereto, and the fluid chamber 162 may be of a closed type in which the space is a closed space.

The board 161 may be disposed in the fluid chamber 162 such that an assembly surface on which the semiconductor light emitting diodes 150 are assembled faces downward. For example, the board 161 may be transferred to an assembly position by a transfer device, and the transfer device may include a stage 165 on which the board is mounted. The position of the stage 165 is controlled by the control unit, and through this, the board 161 may be transferred to the assembly position.

In this case, in the assembly position, the assembly surface of the board 161 faces the bottom of the fluid chamber 150. As shown, the assembly surface of the board 161 is disposed to be immersed in the fluid in the fluid chamber 162. Accordingly, the semiconductor light emitting diode 150 moves to the assembly surface in the fluid.

The board 161 is an assembly board in which an electric field is able to be formed, and may include a base portion 161a, a dielectric layer 161b, and a plurality of electrodes 161c.

The base portion 161a may be formed of an insulating material, and the plurality of electrodes 161c may be a thin or thick bi-planar electrode patterned on one surface of the base portion 161a. The electrode 161c may be formed of, for example, a stack of Ti/Cu/Ti, Ag paste, and ITO.

The dielectric layer 161b may be formed of an inorganic material such as SiO2, SiNx, SiON, Al2O3, TiO2, HfO2, or the like. Alternatively, the dielectric layer 161b may be comprised of a single layer or a multi-layer as an organic insulator. The dielectric layer 161b may have a thickness of several tens of nm to several μm.

Furthermore, the board 161 according to the present disclosure includes a plurality of cells 161d separated by barrier ribs. The cells 161d are sequentially arranged in one direction and may be made of a polymer material. Also, the barrier ribs 161e defining the cells 161d are shared with the neighboring cells 161d. The barrier ribs 161e may protrude from the base portion 161a, and the cells 161d may be sequentially arranged along one direction by the barrier ribs 161e. More specifically, the cells 161d are sequentially arranged in the column and row directions, respectively, and may have a matrix structure.

As shown, the cell 161d may have a groove for accommodating the semiconductor light emitting diode 150 and the groove may be a space defined by the barrier ribs 161e. The shape of the groove may be the same as or similar to that of the semiconductor light emitting diode. For example, when the semiconductor light emitting diode has a rectangular shape, the groove may have a rectangular shape. Also, although not shown, when the semiconductor light emitting diode has a circular shape, the groove formed in the cells may have a circular shape. Furthermore, each of the cells is configured to accommodate a single semiconductor light emitting diode. That is, one semiconductor light emitting diode is accommodated in one cell.

Meanwhile, the plurality of electrodes 161c may include a plurality of electrode lines disposed at the bottom of each of the cells 161d, and the plurality of electrode lines may extend to adjacent cells.

The plurality of electrodes 161c are disposed below the cells 161d, and different polarities are applied to the electrodes 161c to generate an electric field in the cells 161d. To form the electric field, the dielectric layer may form the bottom of the cells 161d while the dielectric layer is covering the plurality of electrodes 161c. In this structure, when different polarities are applied to the pair of electrodes 161c under the cells 161d, an electric field is formed, and the semiconductor light emitting diodes may be inserted into the cells 161d due to the electric field.

In the assembly position, the electrodes of the board 161 are electrically connected to a power supply device 171. The power supply device 171 may apply power to the plurality of electrodes to generate the electric field.

As shown, the self-assembly apparatus may include a magnet 163 for applying a magnetic force to the semiconductor light emitting diodes. The magnet 163 is spaced apart from the fluid chamber 162 to apply a magnetic force to the semiconductor light emitting diodes 150. The magnet 163 may be disposed to face the opposite surface of the assembly surface of the board 161, and the position of the magnet is controlled by the position control unit 164 connected to the magnet 163.

The semiconductor light emitting diode 1050 may include a magnetic material to move in the fluid due to the magnetic field of the magnet 163.

Referring to FIG. 9, a semiconductor light emitting diode including a magnetic material may include a first conductivity type electrode 1052, a second conductivity type electrode 1056, a first conductivity type semiconductor layer 1053 on which the first conductivity type electrode 1052 is disposed, a second conductivity type semiconductor layer 1055 on which the second conductivity type electrode 1056 is disposed, the second conductivity type semiconductor layer 1055 overlapping the first conductivity type semiconductor layer 1052 and an active layer 1054 disposed between the first and second conductivity type semiconductor layers 1053 and 1055.

Here, the first conductivity type may be p-type, the second conductivity type may be n-type, and vice versa. In addition, as described above, the semiconductor light emitting diode having no active layer may be used.

Meanwhile, in the present disclosure, the first conductivity type electrode 1052 may be generated after the semiconductor light emitting diode is assembled to the wiring board through self-assembly of the semiconductor light emitting diode. Also, in the present disclosure, the second conductivity type electrode 1056 may include the magnetic material. The magnetic material may mean a magnetic metal. The magnetic material may be Ni, SmCo, or the like, and as another example, may include a material corresponding to at least one of Gd-based, La-based, and Mn-based materials.

The magnetic material may be provided in the second conductivity type electrode 1056 in the form of particles. Alternatively, the conductivity type electrode including a magnetic material may have one layer formed of a magnetic material. For this example, as shown in FIG. 9, the second conductivity type electrode 1056 of the semiconductor light emitting diode 1050 may include a first layer 1056a and a second layer 1056b. Here, the first layer 1056a may include a magnetic material, and the second layer 1056b may include a metal material rather than a magnetic material.

As shown, in this example, the first layer 1056a including a magnetic material may be disposed to contact the second conductivity type semiconductor layer 1055. In this case, the first layer 1056a is disposed between the second layer 1056b and the second conductivity type semiconductor layer 1055. The second layer 1056b may be a contact metal connected to the second electrode of the wiring board. However, the present disclosure is not necessarily limited thereto, and the magnetic material may be disposed on one surface of the first conductivity type semiconductor layer.

Referring back to FIGS. 6 and 7, more specifically, the self-assembly apparatus is provided with a magnet handler that is movable automatically or manually in the x, y, and z axes on the upper portion of the fluid chamber, or a motor capable of rotating the magnet 163. The magnet handler and the motor may constitute the position control unit 164. Through this, the magnet 163 may rotate in a horizontal direction with the board 161, clockwise or counterclockwise direction.

Meanwhile, a bottom plate 166 having a light-transmitting property may be formed in the fluid chamber 162, and the semiconductor light emitting diodes may be disposed between the bottom plate 166 and the board 161. An image sensor 167 may be disposed to face the bottom plate 166 to monitor the inside of the fluid chamber 162 through the bottom plate 166. The image sensor 167 is controlled by the control unit 172 and may include an inverted type lens, a CCD and the like to observe the assembly surface of the board 161.

The self-assembly apparatus described above is configured to use a combination of a magnetic field and an electric field, and when using this, the semiconductor light emitting diodes may be seated at predetermined positions on the board due to an electric field while moving by a change in the position of the magnet. Hereinafter, an assembly process using the self-assembly apparatus described above will be described in more detail.

First, a plurality of semiconductor light emitting diodes 1050 including a magnetic material are formed through the process described with reference to FIGS. 5A to 5C. In this case, in the process of forming the second conductivity type electrode of FIG. 5C, a magnetic material may be deposited on the semiconductor light emitting diode.

Figure 8A:
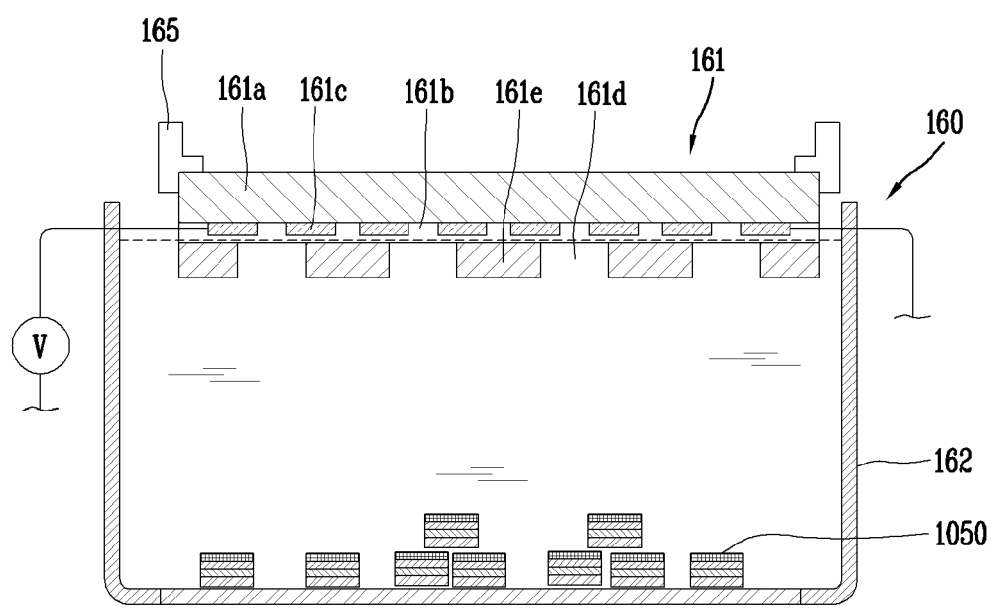
FIGS. 8A to 8E are conceptual views showing a process of self-assembling a semiconductor light emitting diode using the self-assembly apparatus of FIG. 6.
Figure 9:
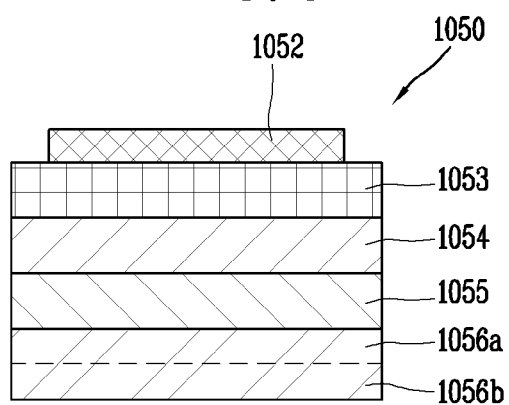
FIG. 9 is a conceptual diagram for describing the semiconductor light emitting diode of FIGS. 8A to 8E.

Next, the board 161 is transferred to an assembly position, and the semiconductor light emitting diodes 1050 are put into the fluid chamber 162 (FIG. 8A).

As described above, the assembly position of the board 161 may be a position in which the board 161 is to be disposed in the fluid chamber 162 such that the assembly surface of the board 161 on which the semiconductor light emitting diodes 1050 are to be assembled faces downward.

In this case, some of the semiconductor light emitting diodes 1050 may sink to the bottom of the fluid chamber 162 and some may float in the fluid. The bottom plate 166 having a light-transmitting property is provided in the fluid chamber 162, and some of the semiconductor light emitting diodes 1050 may sink to the bottom plate 166.

Figure 8B:
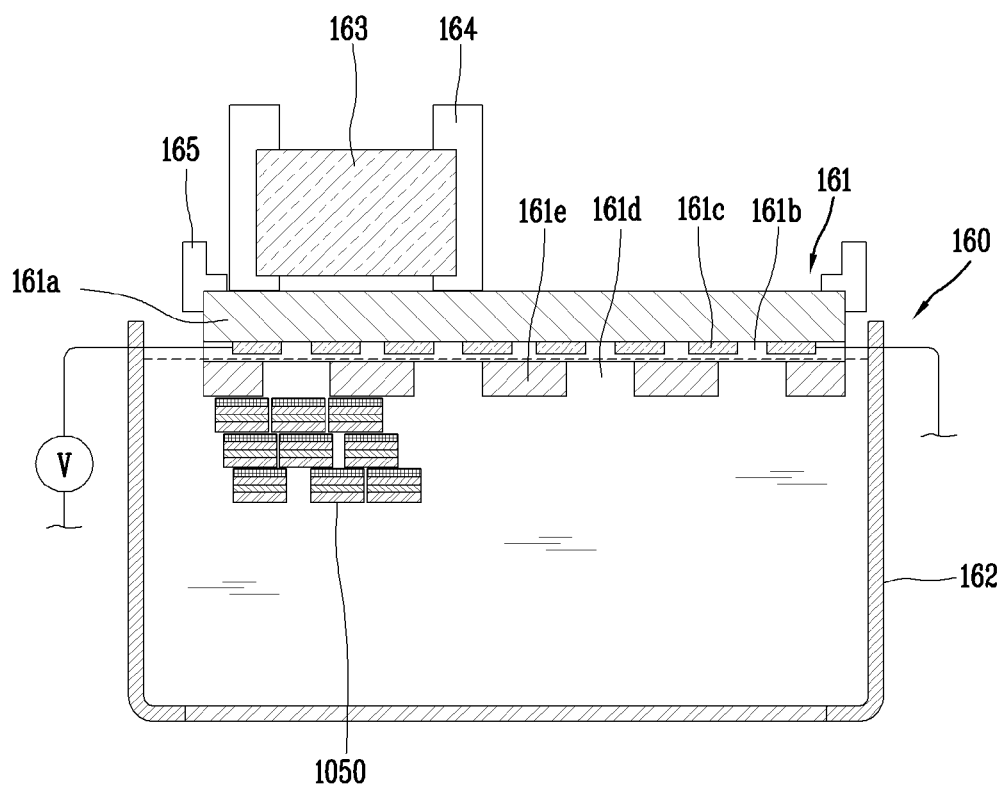

Next, a magnetic force is applied to the semiconductor light emitting diodes 1050 such that the semiconductor light emitting diodes 1050 vertically float in the fluid chamber 162 (FIG. 8B).

When the magnet 163 of the self-assembly apparatus moves from its original position to the opposite surface of the assembly surface of the board 161, the semiconductor light emitting diodes 1050 may float toward the board 161 in the fluid. The original position may be a position deviated from the fluid chamber 162. As another example, the magnet 163 may be made of an electromagnet. In this case, electricity is supplied to the electromagnet to generate an initial magnetic force.

Meanwhile, in this example, when the magnitude of the magnetic force is adjusted, the separation distance between the assembly surface of the board 161 and the semiconductor light emitting diodes 1050 may be controlled. For example, the separation distance is controlled using the weight, buoyancy, and magnetic force of the semiconductor light emitting diodes 1050. The separation distance may be several millimeters to several tens of micrometers from the outermost edge of the board.

Figure 8C:
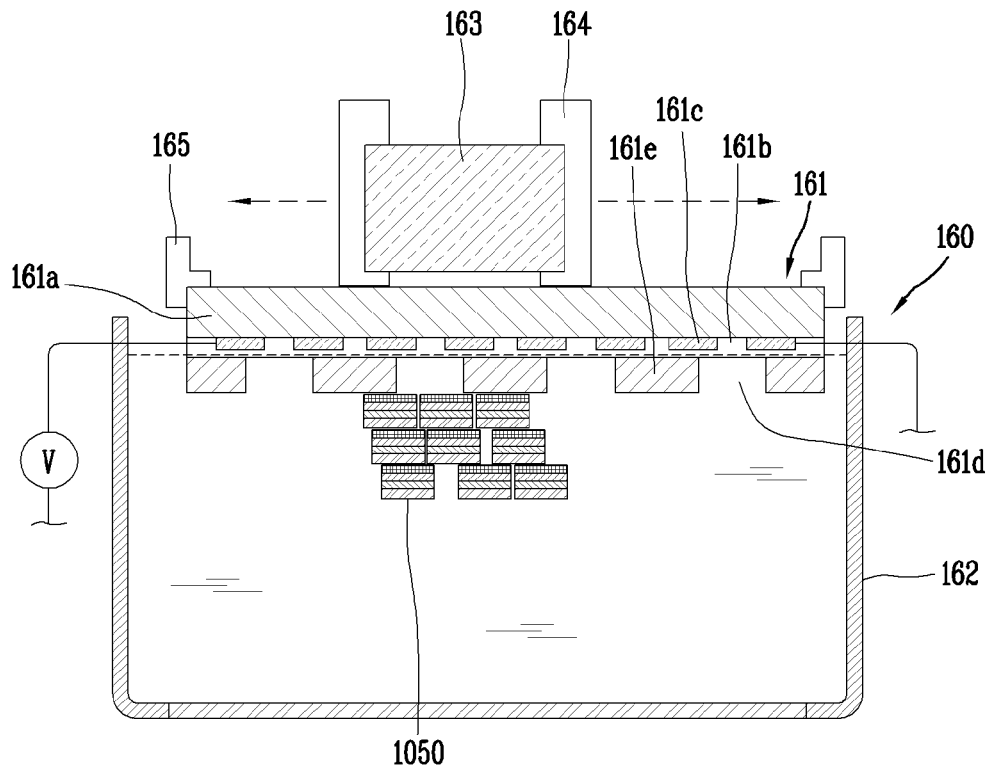

Next, a magnetic force is applied to the semiconductor light emitting diodes 1050 such that the semiconductor light emitting diodes 1050 move in one direction in the fluid chamber 162. For example, it is possible to move the magnet 163 in a direction horizontal to the board, clockwise or counterclockwise (FIG. 8C). In this case, the semiconductor light emitting diodes 1050 move in a direction parallel to the board 161 from positions spaced apart from the board 161 due to the magnetic force.

Next, an electric field is applied to guide the semiconductor light emitting diodes 1050 to preset positions such that the semiconductor light emitting diodes 1050 are seated in the preset positions of the board 161 while the semiconductor light emitting diodes 1050 are moving (FIG. 8C). For example, while the semiconductor light emitting diodes 1050 are moving in a direction horizontal to the board 161, the semiconductor light emitting diodes 1050 may move in a direction perpendicular to the board 161 due to the electric field, and be then seated in the preset positions of the board 161.

More specifically, an electric field is generated by supplying power to the bi-planar electrode of the board 161 to enable assembly to be made only at preset positions. That is, the semiconductor light emitting diodes 1050 are self-assembled at assembly positions of the board 161 by using the selectively generated electric field. To this end, cells in which the semiconductor light emitting diodes 1050 are inserted may be provided in the board 161.

Thereafter, a process of unloading the board 161 is performed, and the assembly process is finished. When the board 161 is an assembly board, a post-process for realizing a display device by transferring the semiconductor light emitting diodes arranged as described above to a wiring board may be performed.

Figure 8D:
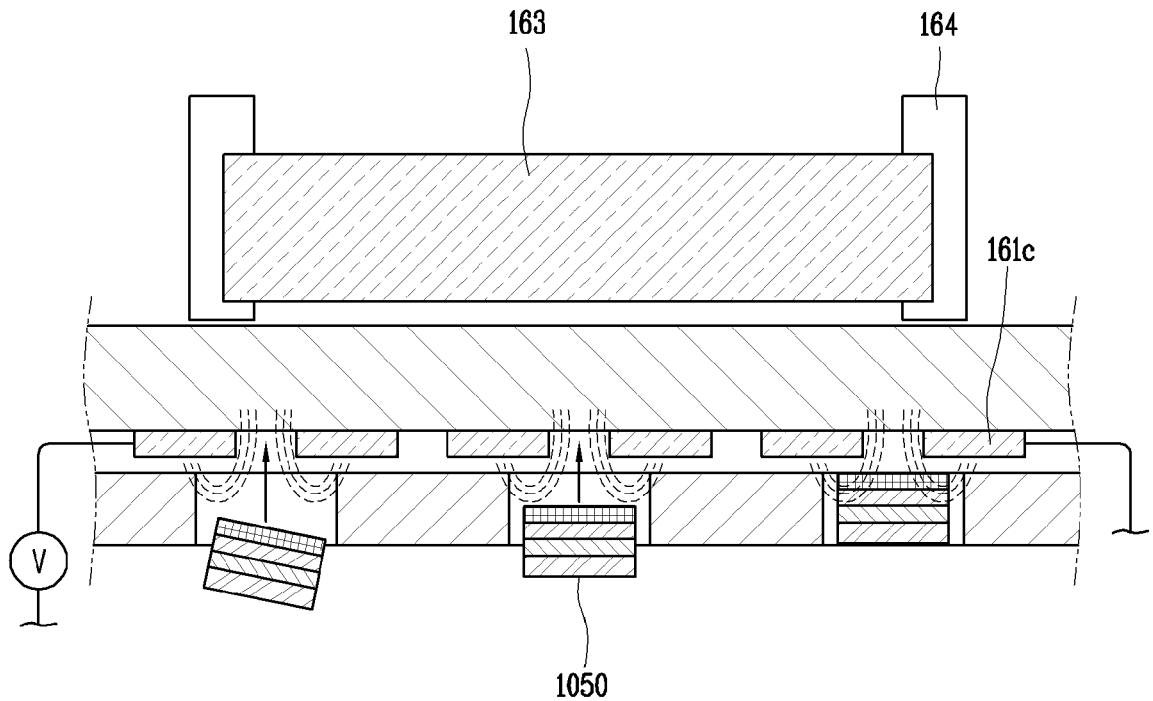
Figure 8E:
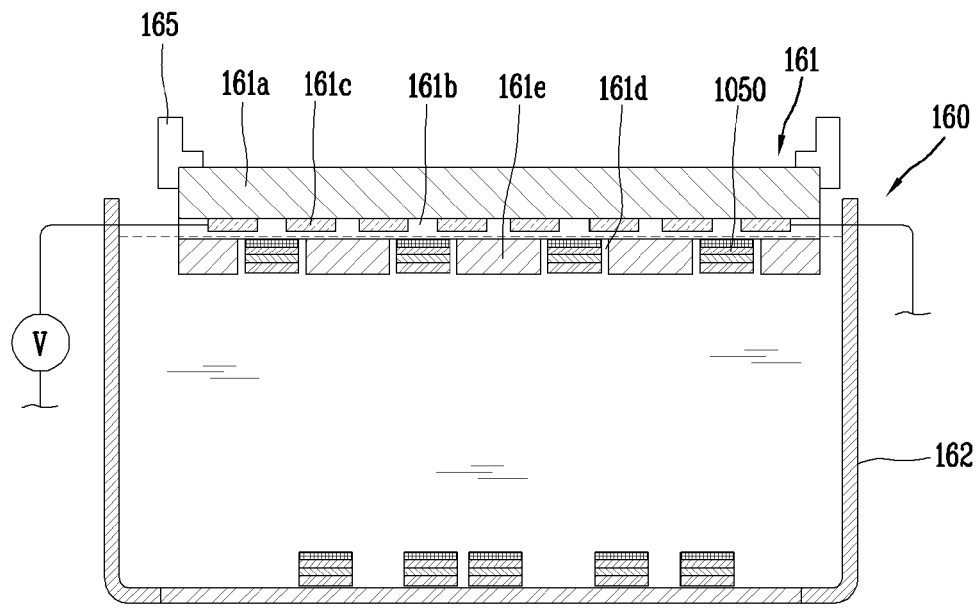

Meanwhile, after guiding the semiconductor light emitting diodes 1050 to the preset positions, the magnet 163 may be moved in a direction away from the board 161 such that the semiconductor light emitting diodes 1050 remaining in the fluid chamber 162 fall to the bottom of the fluid chamber 162 (FIG. 8D). As another example, when power supply is stopped in a case where the magnet 163 is an electromagnet, the semiconductor light emitting diodes 1050 remaining in the fluid chamber 162 may fall to the bottom of the fluid chamber 162.

Thereafter, when the semiconductor light emitting diodes 1050 at the bottom of the fluid chamber 162 are recovered, the recovered semiconductor light emitting diodes 1050 may be reused.

The self-assembly apparatus and method described above may use a magnetic field to enable distant parts to congregate near a predetermined assembly site and apply a separate electric field to the assembly site such that the parts are selectively assembled only to the assembly site in order to increase the assembly yield in fluidic assembly. In this case, the assembly board is placed on the upper portion of the water tank and the assembly surface is directed downward to minimize the effect of gravity due to the weight of the parts and prevent non-specific binding to eliminate defects. That is, to increase the transfer yield, the assembly board is placed on the upper portion to minimize the effect of gravity or frictional force, and to prevent non-specific binding.

As described above, according to the present disclosure having the above configuration, in a display device in which individual pixels are formed of semiconductor light emitting diodes, a large number of semiconductor light emitting diodes may be assembled at once.

As described above, according to the present disclosure, it is possible to pixelate a large amount of semiconductor light emitting diodes on a small-sized wafer and then transfer the semiconductor light emitting diodes to a large-area substrate. Through this, it is possible to manufacture a large-area display device at a low cost.

Hereinafter, a display device using a semiconductor light emitting diode having a novel structure according to an embodiment of the present disclosure will be described with reference to the accompanying drawings.

In order to clarify the features of the present disclosure, some components not related to the features of the present disclosure may not be included in the drawings.

The display apparatus 2000 described in this specification may be implemented in a passive matrix method (hereinafter, PM method) or an active matrix method (hereinafter referred to as AM method).

Figure 10:
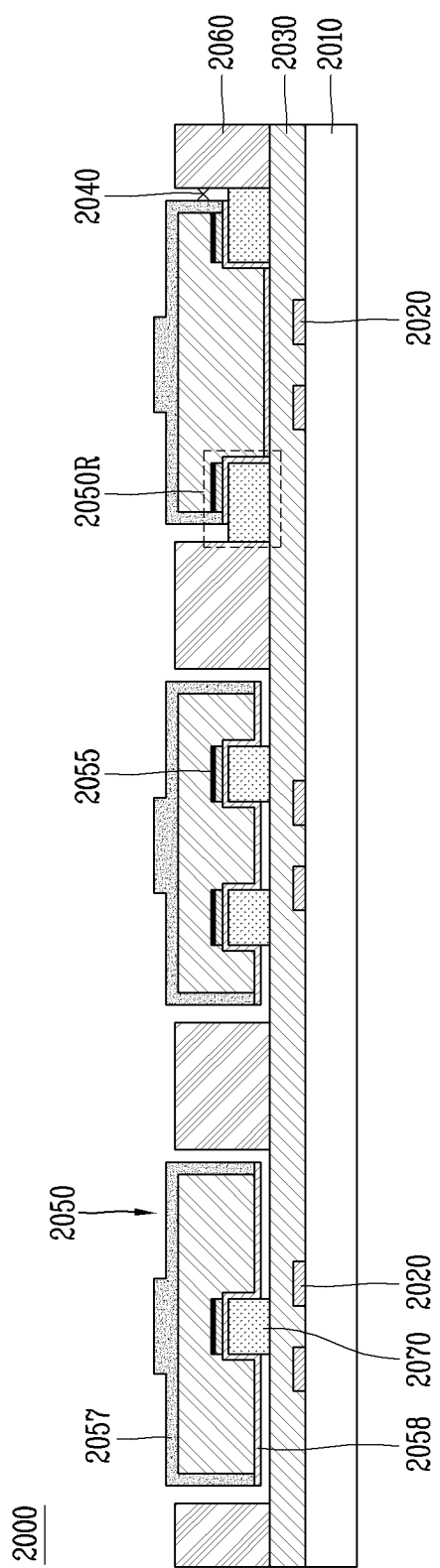
FIG. 10 is a conceptual diagram showing a display device according to an embodiment of the present disclosure.

FIG. 10 is a conceptual diagram showing a display device according to an embodiment of the present disclosure.

The display device 2000 according to an embodiment of the present disclosure may include assembled electrodes 2020, a dielectric layer 2030, a semiconductor light emitting diode 2050 assembled in a cell 2040, and a partition wall portion 2060, a solder portion 2070, a first wiring electrode 2080, and the like, on a base portion 2010.

As an embodiment, the base portion 2010 may be a rigid substrate such as glass, sapphire, silicon, or the like. In another embodiment, the base portion 2010 may be a flexible substrate including a polymer material.

As the polymer material, for example, a material including flexible and insulating PI (polyimide), PEN (polyethylene naphthalate), PET (polyethylene terephthalate), or the like may be used.

Assembled electrodes 2020 extending in one direction may be formed on the base portion 2010. The assembled electrodes 2020 may be formed to a thickness of several hundred nm.

The assembled electrodes 2020 may be configured to form an electric field during self-assembly. Specifically, a voltage signal may be applied to the assembled electrodes 2020 and transmitted in the extension direction.

The assembled electrodes 2020 may be formed of a non-resistive metal corresponding to any one of Al, Mo, Cu, Ag, and Ti, or an alloy selected from these. However, the metal forming the assembled electrodes 2020 is not limited to those described above.

A dielectric layer 2030 may be formed on the base portion 2010 to cover the assembled electrodes 2020. For example, the dielectric layer 2030 may be made of an inorganic insulating material such as $SiO_2$, $SiN_x$, SiON, $Al_2O_3$, $TiO_2$, $HfO_2$, or the like.

In addition, the dielectric layer 2030 may be formed as a single layer or as a multi-layer. For example, when the wiring electrode is disposed under the semiconductor light emitting diode 2050, the dielectric layer 2030 may be formed as a multi-layer including a first dielectric layer covering the wiring electrode and the second dielectric layer covering the assembled electrode 2020 to electrically insulate the assembled electrode 2020 and the wiring electrode.

A partition wall portion 2060 may be stacked on the dielectric layer 2030 while forming a plurality of cells 2040. The plurality of cells 2040 may be formed in a matrix arrangement, and the semiconductor light emitting diodes 2050 may be seated inside the cells 2040 through self-assembly.

The semiconductor light emitting diodes 2050 transferred to the substrate by the self-assembly method may be formed in a symmetrical structure, for example, may be formed in a circular shape.

The partition wall portion 2060 may be formed of an organic insulating material (for example, PAC) made of a polymer material or an inorganic insulating material such as $SiO_2$ or $SiN_x$.

In addition, although not shown in the drawings, a planarization layer (not shown) for electrically insulating the semiconductor light emitting diode 2050 from the wiring electrode while planarizing the upper surface of the semiconductor light emitting diode 2050 seated in the cell 2040 may be included.

According to an embodiment of the present disclosure, the display device 2000 may include semiconductor light emitting diodes 2050 that emit light of different colors. For example, the display device 2000 may include semiconductor light emitting diodes 2050 emitting blue, green, and red light.

According to the present disclosure, the display device 2000 is characterized in that it has a structure capable of simultaneously self-assembling the semiconductor light emitting diodes 2050 that emit light of different colors to a substrate.

To this end, the semiconductor light emitting diodes 2050 that emit light of different colors may include recessed portions 2050R having different shapes on one surface. In addition, the substrate may include a solder portion 2070 protruding from the bottom surface of the cell 2040 to correspond to the recessed portion 2050R of the semiconductor light emitting diode 2050 which is seated (or which will be seated) on the cell 2040.

First, the semiconductor light emitting diode 2050 according to the embodiment of the present disclosure may be a vertical semiconductor light emitting diode 2050.

The vertical semiconductor light emitting diode 2050 can form the active layer 2030 wider than that of the horizontal semiconductor light emitting diode, and thus has an excellent advantage in terms of luminous efficiency. In addition, it is advantageous for miniaturization of the semiconductor light emitting diode 2050.

Figure 15:
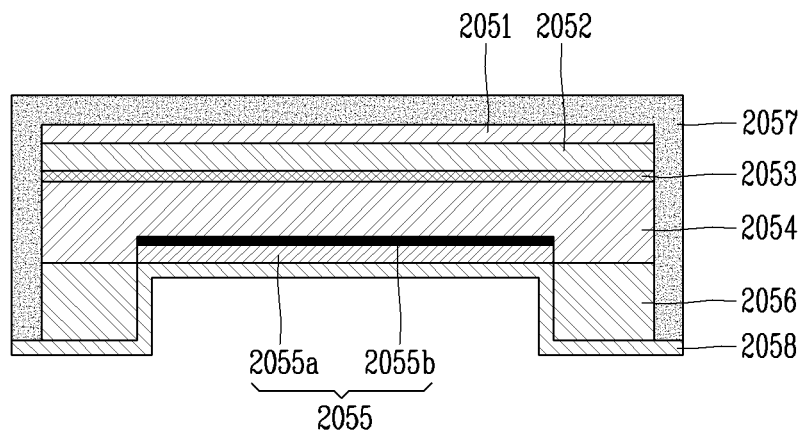
FIG. 15 is a conceptual diagram showing a semiconductor light emitting diode according to an embodiment of the present disclosure.

FIG. 15 is a conceptual diagram showing a semiconductor light emitting diode according to an embodiment of the present disclosure.

According to an embodiment of the present disclosure, the semiconductor light emitting diode 2050 may include a first conductivity type electrode 2051, a first conductivity type semiconductor layer 2052 formed on the first conductivity type electrode 2051, an active layer 2053 formed on the first conductivity type semiconductor layer 2052, a second conductivity type semiconductor layer 2054 formed on the active layer 2053, a second conductivity type electrode 2055 formed on the second conductivity type semiconductor layer 2054, and an undoped semiconductor layer 2056.

In the present embodiment, the first conductivity type electrode 2051 may be formed as a transparent electrode as a side from which light generated in the active layer 2053 is emitted. For example, the first conductivity type electrode 2051 may be formed of indium tin oxide (ITO), Al-doped zinc oxide (AZO), F-doped tin oxide (FTO), or the like.

The undoped semiconductor layer 2056 may be a layer that is not removed when the semiconductor light emitting diodes 2050 grown on the growth substrate are separated from the growth substrate during the manufacturing process of the semiconductor light emitting diode 2050.

In general, semiconductor light emitting diodes 2050 from which the undoped semiconductor layer 2056 is removed are used for self-assembly. However, when the semiconductor light emitting diode 2050 including the undoped semiconductor layer 2056 is used as in the present disclosure, the weight of the semiconductor light emitting diode 2050 itself increases, thereby increasing the assembly speed.

The undoped semiconductor layer 2056 may include a recessed portion 2050R. In other words, the recessed portion 2050R may be formed to pass through the undoped semiconductor layer 2056, and the recessed portion 2050R included in the semiconductor light emitting diodes 2050 emitting light of different colors from each other may be formed by etching different regions of the undoped semiconductor layer 2056.

In addition, the recessed portion 2050R may be formed by etching up to a portion of the second conductivity type semiconductor layer 2054 to form an ohmic.

Meanwhile, the second conductivity type electrode 2055 and the undoped semiconductor layer 2056 may be formed in different regions on the second conductivity type semiconductor layer 2054.

The second conductivity type electrode 2055 may be formed on the region of the second semiconductor layer 2054 overlapping the bottom surface of the recessed portion 2050R. Specifically, the second conductivity type electrode 2055 may be formed along the pattern of the recessed portion 2050R.

The second conductivity type electrode 2055 may further include a magnetic layer 2055b to be induced by a magnetic force during self-assembly. In other words, the second conductivity type electrode 2055 may include a metal layer 2055a and a magnetic layer 2055b for ohmic contact.

The magnetic layer 2055b may be formed of a metal material such as Cr, Ti, or the like in order to improve adhesion to the metal layer 2055a.

Meanwhile, the solder portion 2070 formed on the base portion 2010 and coupled to the recessed portion 2050R can be formed of an element selected from Sn, In, Pb, Bi, Cd, and Zn, an element having a similar melting point to that of the element, or composite of elements.

In addition, the solder portion 2070 may be formed to have a thickness greater than that of the undoped semiconductor layer 2056 based on the stacking direction of the semiconductor light emitting diode 2050.

In addition, although not shown in the drawings, the solder portion 2070 may further include a magnetic layer. In a case where the solder portion 2070 includes a magnetic layer, when a magnetic force acts between the solder portion 2070 and the semiconductor light emitting diode 2050 to remove the fluid contained in the chamber after self-assembly, it is possible to prevent the semiconductor light emitting diode 2050 from being separated from the cell 2040 by the flow of the fluid.

Meanwhile, the base portion 2010 may further include a wiring electrode (hereinafter, a first wiring electrode 2080) formed on the dielectric layer 2030.

The first wiring electrode 2080 may be formed to contact the solder portion 2070 under the solder portion 2070, and thus the second conductivity type electrode 2055 and the first wiring electrode 2080 may be electrically connected to each other by coupling the recessed portion 2050R and the solder portion 2070. Meanwhile, a separate heat treatment step for electrical connection between the second conductivity type electrode 2055 and the first wiring electrode 2080 may be performed.

In addition, the first wiring electrode 2080 may be disposed on the dielectric layer 2030 so as not to overlap the assembled electrodes 2020.

In addition, although not shown in the drawings, a second wiring electrode (not shown) electrically connected to the first conductivity type electrode 2051 of the semiconductor light emitting diode 2050 may be further included. The second wiring electrode may be formed under the semiconductor light emitting diode 2050 like the first wiring electrode 2080 or formed above the semiconductor light emitting diode 2050.

Figure 11:
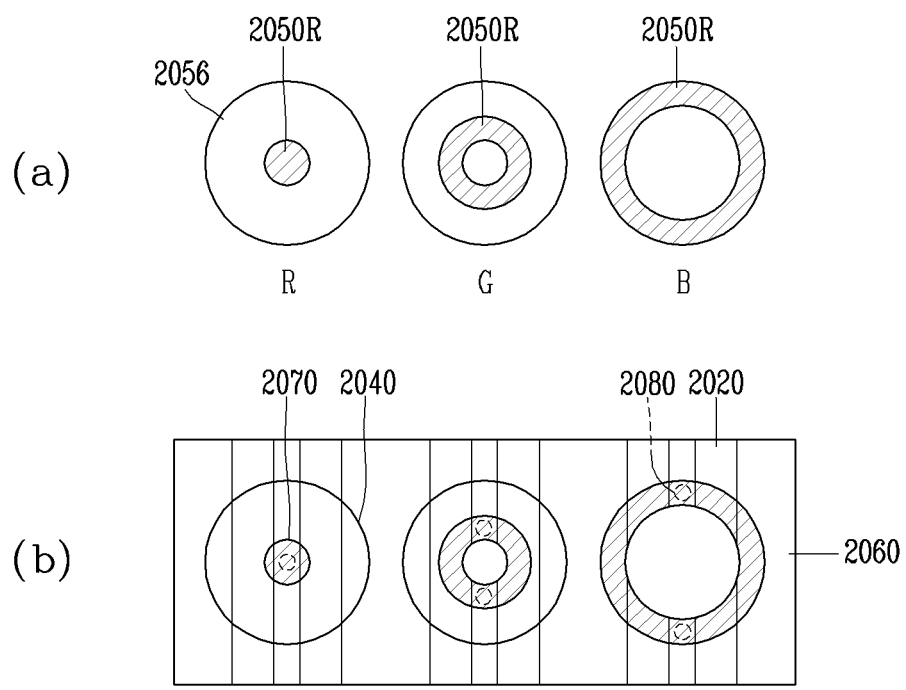
FIG. 11 is a diagram showing a recessed portion of a semiconductor light emitting diode and a pattern of a solder portion of a substrate according to the embodiment of FIG. 10.
Figure 13:
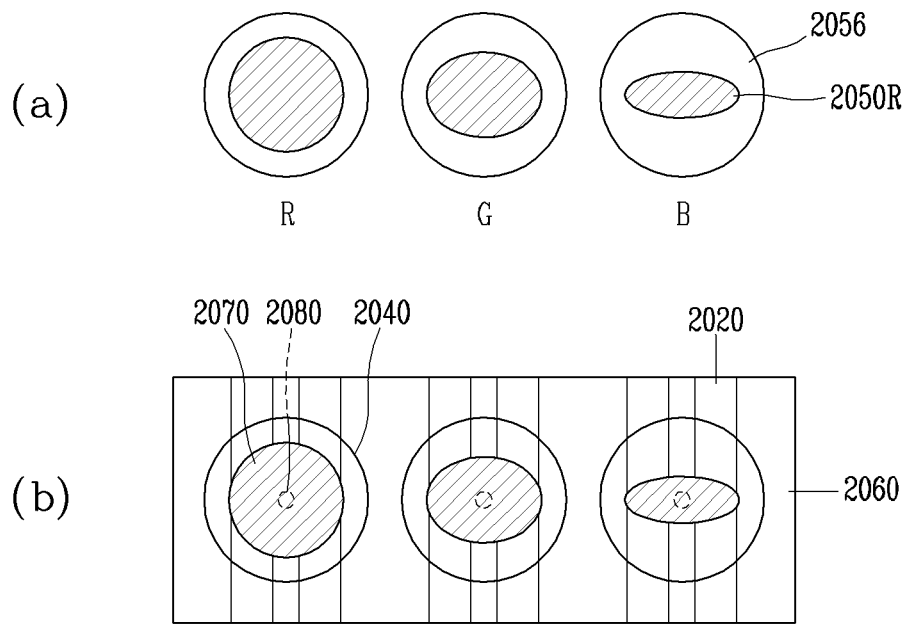
FIGS. 13 and 14 are views showing a recessed portion of a semiconductor light emitting diode and a pattern of a solder portion of a substrate according to another embodiment of the present disclosure.
Figure 14:
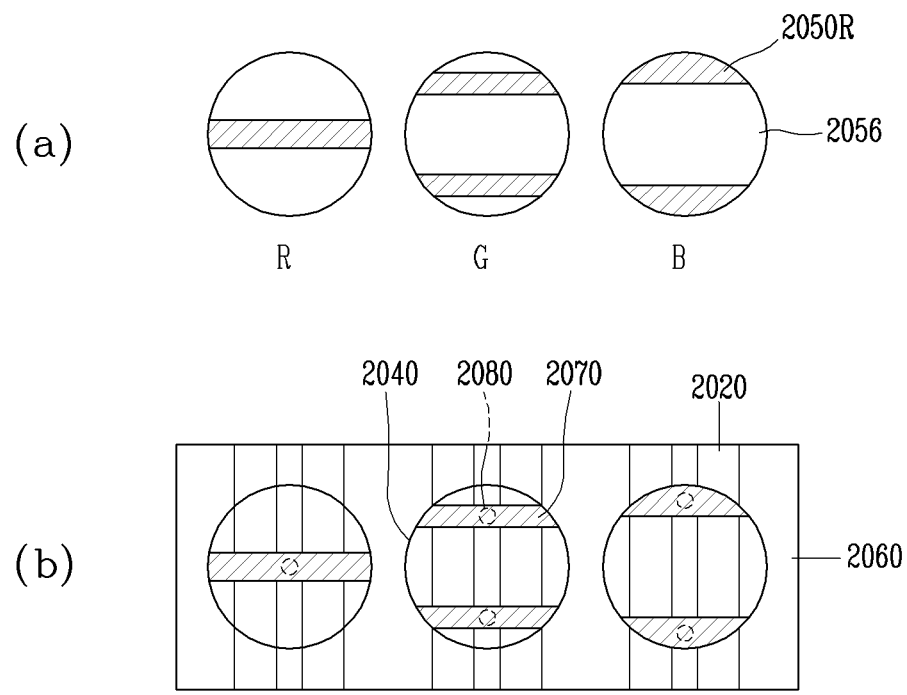

FIG. 11 is a diagram showing a recessed portion of a semiconductor light emitting diode and a pattern of a solder portion of a substrate according to the embodiment of FIG. 10, FIG. 12 is a view showing a comparison of a state where a semiconductor light emitting diode is normally assembled on a substrate and a state where a semiconductor light emitting diode is incorrectly assembled on a substrate, and FIGS. 13 and 14 are views showing a recessed portion of a semiconductor light emitting diode and a pattern of a solder portion of a substrate according to another embodiment of the present disclosure.

As shown in FIGS. 11 to 14, the semiconductor light emitting diode 2050 emitting different colors may include recessed portions 2050R having different shapes.

In an embodiment, as shown in FIGS. 11 and 14, the semiconductor light emitting diode 2050 may include recessed portions 2050R formed at different positions on one surface, and in a bottom surface of the cell 2040, a solder portion 2070 having a shape corresponding to this, respectively may be formed.

In another embodiment, as shown in FIG. 13, the semiconductor light emitting diode 2050 may include a patterned recessed portion 2050R having different aspect ratios on one surface, and in the bottom surface of the cell 2040a, a solder portion 2070 having a shape corresponding to this, respectively may be formed.

The semiconductor light emitting diode 2050 is seated in the cell 2040 including the solder portion 2070 that corresponds to the recessed portion 2050R to be capable of being strongly fixed inside the cell 2040 by the electric field formed by the assembled electrodes 2020.

On the other hand, in a case where the semiconductor light emitting diode 2050 is seated in the cell 2040 including the solder portion 2070 having a pattern that does not correspond to the recessed portion 2050R, the bonding force (surface energy acting between the semiconductor light emitting diode 2050 and the solder portion 2070) is relatively weak, so that the semiconductor light emitting diode cannot be strongly fixed to the cell 2040 and may be easily detached from the cell 2040.

Accordingly, by forming patterns (the recessed portion 2050R and the solder portion 2070) on the semiconductor light emitting diode 2050 and the substrate, respectively, there is an effect in that self-assembly of the semiconductor light emitting diodes 2050 of different colors can be simultaneously performed.

In particular, according to an embodiment of the present disclosure, there is no need to manufacture so that sizes or shapes of the semiconductor light emitting diodes 2050 are different from each other to assemble the semiconductor light emitting diodes that emit light of different colors from each other at the same time.

According to an embodiment of the present disclosure, the semiconductor light emitting diode 2050 may have vertical selectivity when assembling the cell 2040. Hereinafter, the structure of the semiconductor light emitting diode 2050 for this will be described.

Figure 16A:
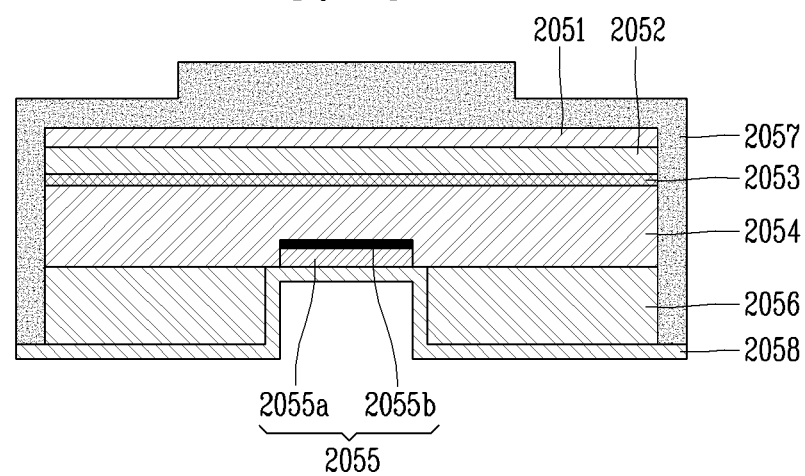
FIGS. 16A and 16B are diagrams showing a semiconductor light emitting diode according to another embodiment of the present disclosure.
Figure 16B:
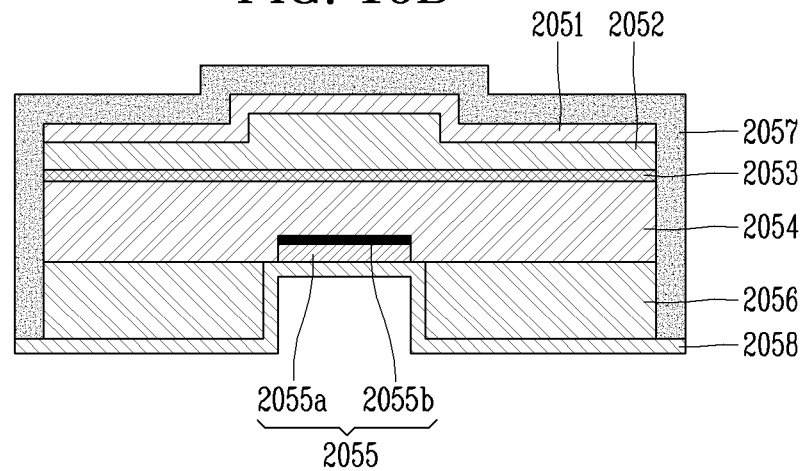

FIGS. 16A and 16B are diagrams showing a semiconductor light emitting diode according to another embodiment of the present disclosure.

First, the semiconductor light emitting diode 2050 may further include a passivation layer 2057 formed on the surface. The passivation layer 2057 may be formed to cover a portion of the surface of the semiconductor light emitting diode including the first conductivity type electrode 2051 on the other surface side of the semiconductor light emitting diode 2050, and, preferably, may be formed to extend from the top surface of the first conductivity type electrode 2051 to the side surface of the semiconductor light emitting diode 2050.

In addition, the passivation layer 2057 may include an open hole for electrically connecting the first conductivity type electrode 2051 to the second wiring electrode.

According to an embodiment of the present disclosure, in the semiconductor light emitting diode 2050, the area of one surface of the semiconductor light emitting diode 2050 including the recessed portion 2050R such that the recessed portion 2050R faces the bottom surface of the cell 2040 and the area of the other surface of the semiconductor light emitting diode 2050 on which the passivation layer 2057 is formed may be formed to be different from each other.

Specifically, in the semiconductor light emitting diode 2050, the area of the passivation layer 2057 on the other side of the semiconductor light emitting diode 2050 may be patterned to be smaller than the area of the undoped semiconductor layer 2056 which is substantially in contact with the bottom surface of the cell 2040 on the one side of the semiconductor light emitting diode 2050.

In one embodiment, as shown in FIG. 16a, the area of the other surface of the semiconductor light emitting diode 2050 may be formed to be smaller than the area of one surface of the semiconductor light emitting diode 2050 by etching the circumferential portion except for the central region of the passivation layer 2057 formed on the other side of the semiconductor light emitting diode 2050.

In another embodiment, as shown in FIG. 16B, the area of the other surface of the semiconductor light emitting diode 2050 may be adjusted by etching a portion of the first conductivity type semiconductor layer 2052 and the first conductivity type electrode 2051 to form a mesa.

In addition, the semiconductor light emitting diode 2050 may further include a metal film 2058 formed along an undoped semiconductor layer 2056 and a recessed portion 2050R on one side of the semiconductor light emitting diode 2050 such that the recessed portion 2050R faces the bottom surface of the cell 2040. The metal film 2058 may be formed of, for example, Ti, but is not limited thereto. Since the semiconductor light emitting diode 2050 includes the metal film 2058, the semiconductor light emitting diode 2050 can be easily guided into the assembly position, that is, into the cell 2040.

As described above, the display device 2000 according to the embodiment of the present disclosure has the effect of being able to perform self-assembly by simultaneously putting the semiconductor light emitting diodes 2050 emitting light of different colors into the fluid chamber.

In particular, since the semiconductor light emitting diodes 2050 are seated at positions where the solder portions 2070 having a pattern corresponding to the recessed parts 2050R formed on one surface are formed, in order to self-assemble the semiconductor light emitting diodes 2050 at the same time., there is no need to manufacture different sizes or shapes of the semiconductor light emitting diodes 2050 that emit light of different colors.

In addition, there is an effect that the semiconductor light emitting diode 2050 may be connected to a wiring electrode through a bonding of the recessed portion 2050R and the solder portion 2070, and the semiconductor light emitting diode 2050 seated in the cell 2040 is stably fixed to the substrate by the magnetic layer included in the solder portion 2070.

The present disclosure described above is not limited to the configuration and method of the above-described embodiments, but the embodiments may be configured by selectively combining all or part of each of the embodiments so that various modifications can be made.

The invention claimed is:

1. A display device comprising:
a base portion;
assembled electrodes extending along one direction on the base portion;
a dielectric layer to cover the assembled electrodes;
a partition wall portion on the dielectric layer while forming a plurality of cells; and
a plurality of semiconductor light emitting diodes seated in the plurality of cells, respectively, and to emit light of different colors,
wherein the plurality of semiconductor light emitting diodes emitting different colors include recessed portions having different shapes, and
wherein a surface of the plurality of cells includes a solder portion protruding to correspond to the recessed portions of the plurality of semiconductor light emitting diodes seated in the plurality of cells, respectively.

2. The display device of claim 1, further comprising:
a first wiring electrode on the dielectric layer,
wherein the first wiring electrode contacts the solder portion under the solder portion and is disposed between the assembled electrodes.

3. The display device of claim 1, wherein the recessed portions having different shapes further have different radii from respective centers of the recessed portions.

4. The display device of claim 1, wherein some of the recessed portions have a rounded shape.

5. The display device of claim 4, wherein the rounded shape includes a circular shape, an oval shape, and an annular shape.

6. The display device of claim 1, wherein the assembled electrodes include a first assembled electrode and a second assembled electrode that are separated by a gap, and
wherein the recessed portions overlap the gap.

7. The display device of claim 6, wherein the recessed portions having different shapes have curvatures at opposite ends.

8. The display device of claim 7, wherein the recessed portions extend in another direction that intersects the one direction.

9. The display device of claim 1, wherein a semiconductor light emitting diode among the plurality of semiconductor light emitting diodes includes:
a first conductivity type electrode;
a first conductivity type semiconductor layer on the first conductivity type electrode;
an active layer on the first conductivity type semiconductor layer;
a second conductivity type semiconductor layer on the active layer;
a second conductivity type electrode on the second conductivity type semiconductor layer; and
an undoped semiconductor layer on the second conductivity type semiconductor layer.

10. The display device of claim 9, wherein the semiconductor light emitting diode further includes a metal film formed along the undoped semiconductor layer and a recessed portion on one side of the semiconductor light emitting diode from among the recessed portions.

11. The display device of claim 9, wherein the solder portion has a thickness that is greater than a thickness of the undoped semiconductor layer based on a stacking direction of the semiconductor light emitting diode.

12. The display device of claim 9, wherein the second conductivity type electrode further includes a magnetic layer.

13. The display device of claim 12, wherein the solder portion further includes a magnetic layer.

14. The display device of claim 12, wherein a size of the magnetic layer of the second conductivity type electrode is about the same as a size of a recessed portion for the semiconductor light emitting diode from among the recessed portions.

15. The display device of claim 9, wherein a recessed portion for the semiconductor light emitting diode from among the recessed portions penetrates through the undoped semiconductor layer, and
wherein the second conductivity type electrode is formed in a region different from a region in which the undoped semiconductor layer is formed among an entire region of the second conductivity type semiconductor layer.

16. The display device of claim 15, wherein the semiconductor light emitting diode further includes a passivation layer covering a portion of a surface of the semiconductor light emitting diode including the first conductivity type electrode on another side of the semiconductor light emitting diode.

17. The display device of claim 16, wherein the passivation layer on the another side of the semiconductor light emitting diode is patterned to be smaller than an area of the undoped semiconductor layer formed on a side of the semiconductor light emitting diode.

18. A display device comprising:

a base substrate;

a plurality of semiconductor light emitting diodes seated on the base substrate and configured to respectively emit light of different colors, the plurality of semiconductor light emitting diodes having recessed portions of different shapes that correspond with the different colors; and a plurality of solder portions protruding from the base substrate to have different shapes, and positioned in the recessed portions of the plurality of semiconductor light emitting diodes, respectively.

19. The display device of claim 18, further comprising:

a plurality of assembled electrodes separated from one another, and extending along one direction on the base substrate;

a dielectric layer to cover the plurality of assembled electrodes; and a partition wall portion on the dielectric layer to define a plurality of cells, wherein the plurality of semiconductor light emitting diodes are seated in the plurality of cells, respectively.

20. The display device of claim 19, wherein the plurality of assembled electrodes include a first assembled electrode and a second assembled electrode that are separated by a gap, and wherein the recessed portions overlap the gap.

* * * * *